(12) United States Patent
Cohn et al.

(10) Patent No.: US 8,565,510 B2
(45) Date of Patent: Oct. 22, 2013

(54) METHODS FOR READING A FEATURE PATTERN FROM A PACKAGED DIE

(75) Inventors: John M. Cohn, Richland, VT (US); Mark J. Flemming, Essex Junction, VT (US); John C. Malinowski, Jericho, VT (US); Karl V. Swanke, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/359,818

(22) Filed: Jan. 27, 2012

(65) Prior Publication Data

US 2012/0120758 A1    May 17, 2012

Related U.S. Application Data

(63) Continuation of application No. 12/193,825, filed on Aug. 19, 2008, now Pat. No. 8,187,897.

(51) Int. Cl.
*G06K 9/00* (2006.01)

(52) U.S. Cl.
USPC ......... 382/145; 73/603; 359/1; 359/901; 438/14; 438/16

(58) Field of Classification Search
USPC ............ 382/145; 702/38, 39, 48; 73/603
See application file for complete search history.

(56) References Cited

U.S. PATENT DOCUMENTS

| | | | | |
|---|---|---|---|---|
| 3,244,975 A | * | 4/1966 | Bauer | 324/533 |
| 3,255,406 A | * | 6/1966 | Schluter | 324/523 |
| 4,312,229 A | * | 1/1982 | Hurwitz et al. | 73/603 |
| 4,343,877 A | * | 8/1982 | Chiang | 430/5 |
| 4,546,283 A | * | 10/1985 | Adamo et al. | 310/313 R |
| 4,698,631 A | * | 10/1987 | Kelly et al. | 340/853.1 |
| 4,729,128 A | * | 3/1988 | Grimes et al. | 382/116 |
| 4,947,351 A | * | 8/1990 | Moran et al. | 702/39 |
| 5,538,554 A | | 7/1996 | Wang et al. | |
| 5,789,302 A | | 8/1998 | Mitwalsky et al. | |
| 6,089,095 A | * | 7/2000 | Yang et al. | 73/600 |

(Continued)

FOREIGN PATENT DOCUMENTS

WO    2006064921 A2    6/2006

OTHER PUBLICATIONS

Yu et al., Scanning acoustic microscopy and its applications to material Characterization, Oct. 1995, Reviews of Modern Physics, vol. 67, No. 4, p. 863-891.*

(Continued)

*Primary Examiner* — Jayesh A Patel
*Assistant Examiner* — Iman K Kholdebarin
(74) *Attorney, Agent, or Firm* — Wood, Herron & Evans LLP; Anthony J. Canale

(57) ABSTRACT

Methods for tracking the identity of die after singulation from a wafer. The product chips and die include a pattern of features formed in a metallization level of a back-end-of-line (BEOL) wiring structure. The features in the pattern contain information relating to the die, such as a unique identifier that includes a wafer identification used to fabricate the die and a product chip location for the die on a wafer. The features may be imaged with the assistance of a beam of electromagnetic radiation that penetrates into a packaged die and is altered by the presence of the features in a way that promotes imaging.

10 Claims, 9 Drawing Sheets

(56) References Cited

U.S. PATENT DOCUMENTS

| | | | |
|---|---|---|---|
| 6,193,664 B1* | 2/2001 | Guracar et al. | 600/453 |
| 6,261,945 B1 | 7/2001 | Nye, III et al. | |
| 6,382,029 B1* | 5/2002 | Shoureshi et al. | 73/643 |
| 6,400,037 B1* | 6/2002 | Omizo | 257/797 |
| 6,429,890 B1 | 8/2002 | Corbett | |
| 6,448,632 B1* | 9/2002 | Takiar et al. | 257/659 |
| 6,449,566 B1* | 9/2002 | Oeschger | 702/54 |
| 6,519,535 B1* | 2/2003 | Petri et al. | 702/42 |
| 6,580,957 B2 | 6/2003 | Canella | |
| 6,812,477 B2* | 11/2004 | Matsunami | 250/548 |
| 6,870,127 B2 | 3/2005 | Han et al. | |
| 7,220,606 B2* | 5/2007 | Matsunami | 438/14 |
| 7,437,934 B2* | 10/2008 | Shoureshi | 73/643 |
| 7,716,005 B2* | 5/2010 | Shoureshi et al. | 702/131 |
| 7,779,691 B2* | 8/2010 | Ghoshal et al. | 73/593 |
| 7,783,432 B2* | 8/2010 | Orth et al. | 702/38 |
| 8,132,462 B2* | 3/2012 | Azuma et al. | 73/603 |
| 8,187,897 B2* | 5/2012 | Cohn et al. | 438/8 |
| 8,299,609 B2* | 10/2012 | Cohn et al. | 257/730 |
| 2003/0001256 A1* | 1/2003 | Sato et al. | 257/723 |
| 2004/0023466 A1 | 2/2004 | Yamauchi | |
| 2004/0102023 A1 | 5/2004 | Morozumi et al. | |
| 2005/0004458 A1* | 1/2005 | Kanayama et al. | 600/437 |
| 2005/0013927 A1 | 1/2005 | Yamazaki | |
| 2005/0187471 A1* | 8/2005 | Kanayama et al. | 600/437 |
| 2007/0230756 A1* | 10/2007 | Wen et al. | 382/128 |
| 2008/0093746 A1 | 4/2008 | Lee et al. | |
| 2008/0194506 A1 | 8/2008 | Iacobelli et al. | |
| 2009/0064078 A1* | 3/2009 | Kimura | 716/11 |
| 2009/0301199 A1* | 12/2009 | Azuma et al. | 73/603 |
| 2010/0044858 A1* | 2/2010 | Cohn et al. | 257/734 |
| 2012/0316803 A1* | 12/2012 | Simon et al. | 702/58 |

OTHER PUBLICATIONS

USPTO, Office Action issued in related U.S. Appl. No. 13/360,055 dated Mar. 29, 2012.

Whipp, "Researchers Smash the Inkjet Resolution Barrier", www.printweek.com/news, Sep. 11, 2007, 1 page.

Sonoscan, Inc., "C-Mode", http://www.sonoscan.com/technology/imode-cmode.html, retrieved on Jul. 17, 2008, publication date unknown, 1 page.

Partee, "The Use of Scanning Acoustic Microscopy in Electronics Manufacturing Applications", EMPFasis, National Electronics Manufacturing Center of Excellence, Dec. 2004, 3 pages.

European Patent Office, Search Report and Written Opinion issued in related international application No. PCT/E2009/058419 dated Dec. 18, 2009.

Yao Peng et al., "Chemical lithography" Journal of Vacuum Science and Technology: part B, AVS/AIP, Melville, New York, NY, vol. 24, No. 6, Oct. 31, 2006; pp. 2553-2559.

The International Bureau of WIPO, International Preliminary Report on Patentability issued in related International Application No. PCT/EP2009/058419 dated Feb. 22, 2011.

USPTO, Notice of Allowance issued in related U.S. Appl. No. 12/193,825 dated Jan. 10, 2012.

USPTO, Office Action issued in related U.S. Appl. No. 12/193,825 dated Aug. 29, 2011.

\* cited by examiner

METHODS FOR READING A FEATURE PATTERN FROM A PACKAGED DIE

CROSS-REFERENCE TO RELATED APPLICATIONS

This application is a continuation of application Ser. No. 12/193,825, filed Aug. 19, 2008, which is hereby incorporated by reference herein in its entirety for all purposes.

BACKGROUND

The invention relates generally to integrated circuit fabrication and, in particular, to product chips and die with a feature pattern that contains information relating to the product chip, methods for fabricating product chips containing the information, and methods for reading the information from the packaged die.

Product chips, which are built using a semiconductor wafer, are usually much smaller than the wafer. In fact, as many as dozens of chips up to tens of thousands of product chips may be fabricated using a single wafer. The actual number of product chips yielded from a wafer is a function of the wafer size, as well as the individual chip size. Wafer manufacturers typically mark bare wafers, usually by laser impingement, with a code or identifier at a particular location around the wafer edge. The identification code, which is unique to each wafer, may be human-readable, machine-readable, or both. Hence, at the wafer manufacturer level, the smallest trackable physical unit is usually the wafer.

At the foundry, a series of processes used to fabricate integrated circuits or product chips containing device structures, such as field effect transistors, use the wafer as a foundation. Product chips are fabricated in parallel across the surface area of the wafer in repeating patterns using a set of masks to replicate the device structures. During certain steps of the chip fabrication process, measurements made on manufacturing equipment may be traceable at some level to the unique wafer identification code applied by the wafer manufacturer. At the conclusion of the fabrication process, the individual product chips are singulated (i.e., separated from each other) using a dicing operation that yields a corresponding plurality of die. Kerf or scribe-line channels are reserved as product dead space between the product chips for the purpose of singulation. A mechanical or laser apparatus cuts or scribes the wafer along the scribe-line channels to physically singulate the product chips into die.

Unfortunately, after physical separation from the wafer, the various singulated die are separated from the unique wafer identification code assigned by the wafer manufacturer. Hence, the parent wafer of origin is no longer identifiable for the product chips. In addition, the particular position of any arbitrary product chip in the array of product chips on a wafer is lost. This complete loss of identity may be accepted as a natural consequence of the singulation process.

Conventionally, however, special provisions may be made to retain all or part of the identity of each singulated die. In this regard, one conventional approach for retaining the die identity is to sequence the die by hand, which maintains the position-on-the-wafer information. However, manual tracking is error prone and, furthermore, is costly and time consuming with a low confidence of success in an actual manufacturing environment. Another conventional approach is to partition only a single wafer in a wafer lot and/or module lot, which may not be practical given floor control and other hardware tracking methodologies, equipment, and regulations.

Another approach is to laser scribe the backside of the chip with an identifier similar to the identifier applied by wafer manufacturers to mark bare wafers. However, laser scribing involves additional time and expense and is prohibited if the chip backside is to be altered by additional chemical or mechanical processing. Furthermore, when a die is encased in a plastic or other material package, then the laser-scribed identifier is no longer visible. A destructive de-packaging operation may be able to recover the information by making the identifier visible. However, de-packaging may prohibit continued use of the die.

Electrical Chip Identification (ECID) represents another conventional approach for retaining the identity of a product chip after singulation. In ECID, a bank of fuses is blown by application of a high voltage to generate an identifier. The configuration of the blown fuses may be electrically read to retrieve the identifier from the die. This approach is rather expensive in terms of the amount of chip real estate consumed for the fuses, which cannot be used to fabricate devices of the integrated circuit product. Moreover, the fuse blowing operation is time intensive and may result in yield losses. As chip dimensions shrink, the real estate available for both standard chip marking and, to a lesser extent, non-destructive ECID becomes smaller as well.

What is needed, therefore, are improved methods for associating information, such as a unique identifier, with die and product chips for tracking purposes after singulation from the wafer, as well as improved methods of nondestructively and non-invasively reading information, such as a unique identifier, from a product chip or die, and product chips and die carrying information, such as a unique identifier, that can be externally read in a non-destructive and non-invasive manner from the exterior of a product package.

SUMMARY

In an embodiment of the invention, a structure includes a die having an integrated circuit with a back-end-of-line (BEOL) wiring structure and at least one active device connected with the BEOL wiring structure. A pattern of features is included in a metallization level of the BEOL wiring structure. The features in the pattern contain information relating to the die. In one embodiment, the information represented by the features of the pattern may be a unique identifier that includes a wafer identification for a wafer used to fabricate the die and a product chip location for the die on the wafer.

In another embodiment of the invention, a method is provided for fabricating a product chip on a wafer. The method includes forming an integrated circuit using the wafer and forming a back-end-of-line (BEOL) wiring structure that includes a metallization level, which is connected with at least one active device of the integrated circuit. The method further includes forming a pattern with a plurality of features containing information relating to the product chip in the metallization level of the BEOL wiring structure.

In another embodiment of the invention, a method is provided for reading information stored as a pattern of features in a metallization level of a back-end-of-line (BEOL) wiring structure carried on a packaged die. The method includes nondestructively directing a beam of penetrating electromagnetic radiation into the packaged die and acquiring an image of the pattern of features from a portion of the beam influenced by the features.

The pattern of features provides the ability to uniquely identify individual product chips and die for the purpose of permanent traceability. In one embodiment, the pattern of features may have the form of an identifier or serial number that can be encoded with relevant information for the integrated circuit manufacturer. The permanent identification of individual product chips with the pattern of features may improve current methods of quality control, failure analysis, and inventory control. In particular, the pattern of features will permit manufacturers to more easily trace fabrication problems to their source, which may be especially acute for die that fail after packaging and are returned to the manufacturer for failure analysis. With the benefit of the pattern of features, failure analysis data can be tied back to a particular lot or batch, a particular wafer, and/or a position of a product chip within a wafer. Identifying the root cause of product chip failures can enhance process control.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
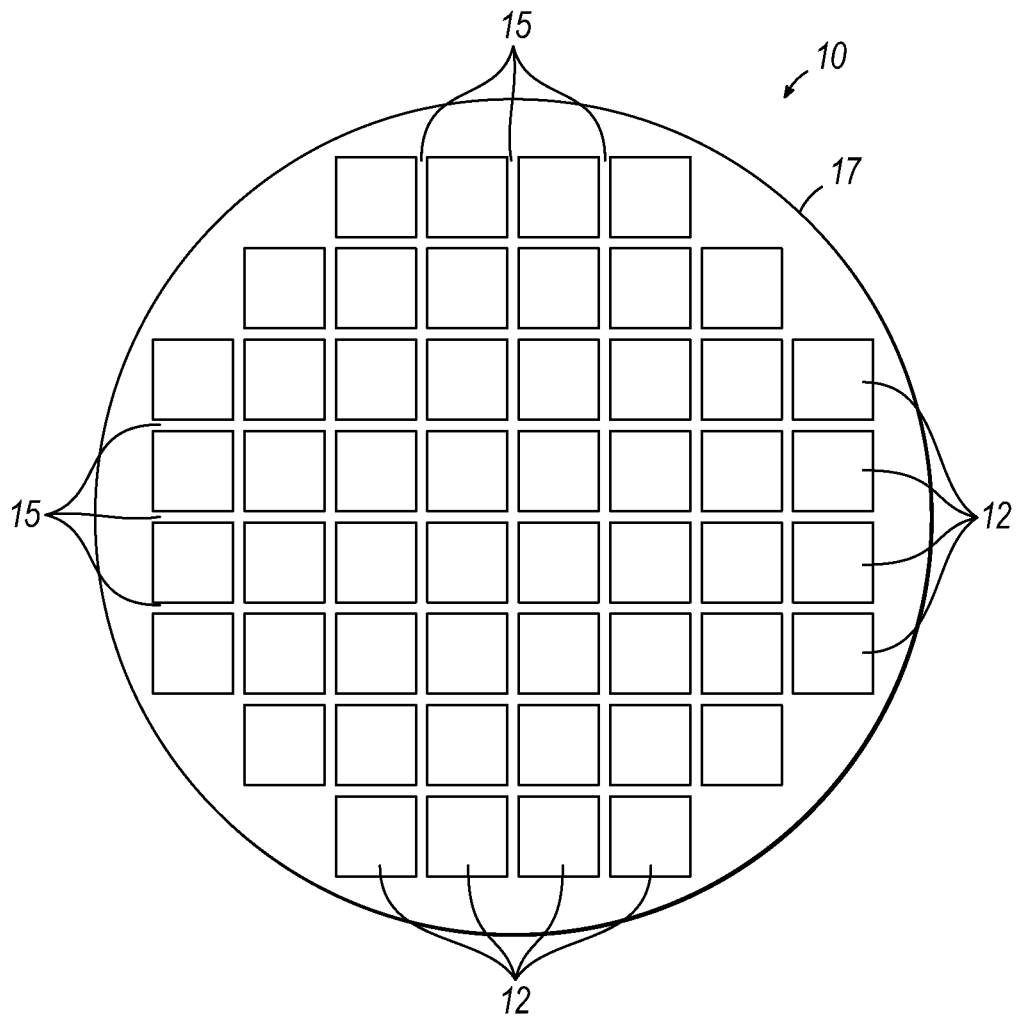
FIG. 1 is a diagrammatic top view of a wafer carrying multiple product chips in accordance with an embodiment of the invention.
Figure 2:
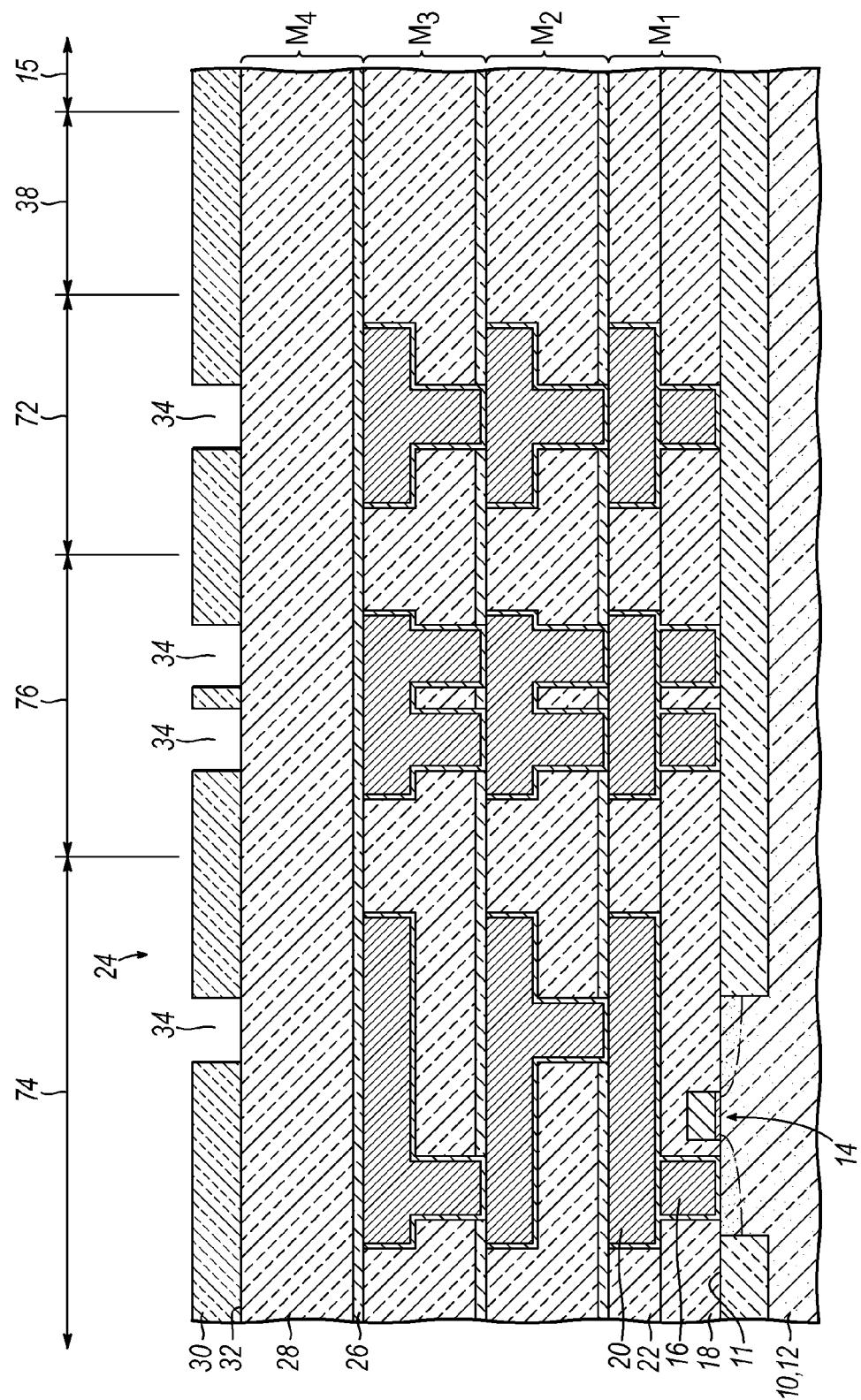
FIGS. 2-5 are diagrammatic cross-sectional views of a portion of one of the product chips in FIG. 1 illustrating successive stages of a fabrication process forming a readable pattern in a back-end-of-line metallization level in accordance with an embodiment of the invention.

With reference to FIG. 1 and in accordance with an embodiment of the invention, a wafer 10 includes a front side 11 (FIG. 2) that has been processed by front-end-of-line processes to fabricate a plurality of substantially identical product chips 12. Each product chip 12 includes one or more integrated circuits that contain device structures, such as a representative device 14 (FIG. 2). The product chips 12 are arranged in an array of rows and columns within the outer periphery of the wafer 10. The number of product chips 12 may range from approximately ten to up to tens of thousands of chips. Among other factors, the actual number of product chips 12 yielded from wafer 10 is a function of the individual chip size, as well as the wafer size. Scribe-line channels 15 are present between adjacent pairs of product chips 12 in the array. The scribe-line channels 15 are free of device structures of the integrated circuit, but may contain test devices used to evaluate post-fabrication circuit quality.

Wafer 10 may be any suitable substrate containing a semiconductor material that a person having ordinary skill in the art would recognize as suitable for forming an integrated circuit. For example, the wafer 10 may be composed of a monocrystalline silicon-containing material, such as bulk or SOI single crystal silicon. The semiconductor material constituting wafer 10 may be lightly doped with an impurity to alter its electrical properties. Specifically, the wafer 10 may be lightly doped with an n-type impurity species to render it initially n-type or lightly doped with a p-type impurity species to render it initially p-type. Standard round wafer sizes for wafer 10 range from a diameter of 100 mm to a diameter of 300 mm. The wafer 10 also includes a back side 13 (FIG. 8) that is connected to the front side 11 by a peripheral edge 17.

With reference to FIG. 2, the devices on the wafer 10, such as the representative device 14, are coupled by contacts 16 in a dielectric layer 18 and wires 20 in a dielectric layer 22 of a local interconnect metallization level (M1 level) with each other and with the overlying metallization levels (M2 level, M3 level, M4 level, etc.) of a back-end-of-line (BEOL) wiring structure, which is generally indicated by reference numeral 24. Typical constructions for the BEOL wiring structure 24 consist of about two (2) to about eight (8) metallization levels. In the representative embodiment, the M4 level constitutes the uppermost level in the BEOL wiring structure 24. The local interconnect metallization level and each of the overlying metallization levels of the BEOL wiring structure 24 are formed by known lithography and etching techniques characteristic of damascene processes conventionally associated with BEOL processing and as described below with particularity for the M4 level.

To form the uppermost M4 level of the BEOL wiring structure 24, an etch stop layer 26 and an interlayer dielectric layer 28 are applied on a top surface of the M3 level by a conventional deposition technique recognized by a person having ordinary skill in the art. The etch stop layer 26 is disposed as a cap on the underlying M3 level. The etch stop layer 26 may be formed from any dielectric material that etches selectively to the dielectric material forming the dielectric layer 28. For example, the etch stop layer 26 may be a thin film composed of silicon nitride ($Si_3N_4$), silicon carbonitride (SiCN), silicon oxycarbonitride (SiOCN), or silicon carbide (SiC) deposited by, for example, plasma enhanced chemical vapor deposition (PECVD).

Dielectric layer 28 may comprise any suitable organic or inorganic dielectric material recognized by a person having ordinary skill in the art. Candidate inorganic dielectric materials for dielectric layer 28 may include, but are not limited to, silicon dioxide, fluorine-doped silicon glass (FSG), and combinations of these dielectric materials. Alternatively, the dielectric material constituting dielectric layer 28 may be characterized by a relative permittivity or dielectric constant smaller than the dielectric constant of silicon dioxide, which is about 3.9. Candidate low-k dielectric materials for dielectric layer 28 include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (SiCOH), and carbon-doped oxides, and combinations of these and other organic and inorganic dielectrics. If the dielectric layer 28 is composed of a low-k dielectric material, the physical and material properties of etch stop layer 26 may be adjusted so that layer 26 operates as a barrier film that optimizes resist poisoning characteristics. Dielectric layer 28 may be deposited by any number of well known conventional techniques such as sputtering, spin-on application, chemical vapor deposition (CVD) process or a PECVD process.

A resist layer 30 composed of a radiation-sensitive organic material is applied as a thin film to a top surface 32 of dielectric layer 28 by spin coating. The resist layer 30 is pre-baked, exposed to radiation to impart a latent image of a via pattern, baked, and then developed with a chemical developer. The chemical developer removes nonpolymerized material to transform the latent image of the via pattern in the resist layer 30 into a final image pattern. The final image pattern imparted in the resist layer 30 includes laterally dispersed openings 34. Each of the openings 34 defines a window that reveals a distinct surface area of dielectric layer 28. Procedures for applying and lithographically patterning the resist layer 30 using a photomask and lithography tool are known to a person having ordinary skill in the art.

In an alternative embodiment, a hardmask (not shown) of a conventional single layer or multilayer construction may applied to the top surface 32 of the dielectric layer 28 before the resist layer 30. In subsequent patterning steps, the hardmask is etched in conjunction with the resist layer 30, which is removed after patterning the hardmask. The hardmask then serves as the primary mask for the etching process of FIG. 3.

Figure 3:
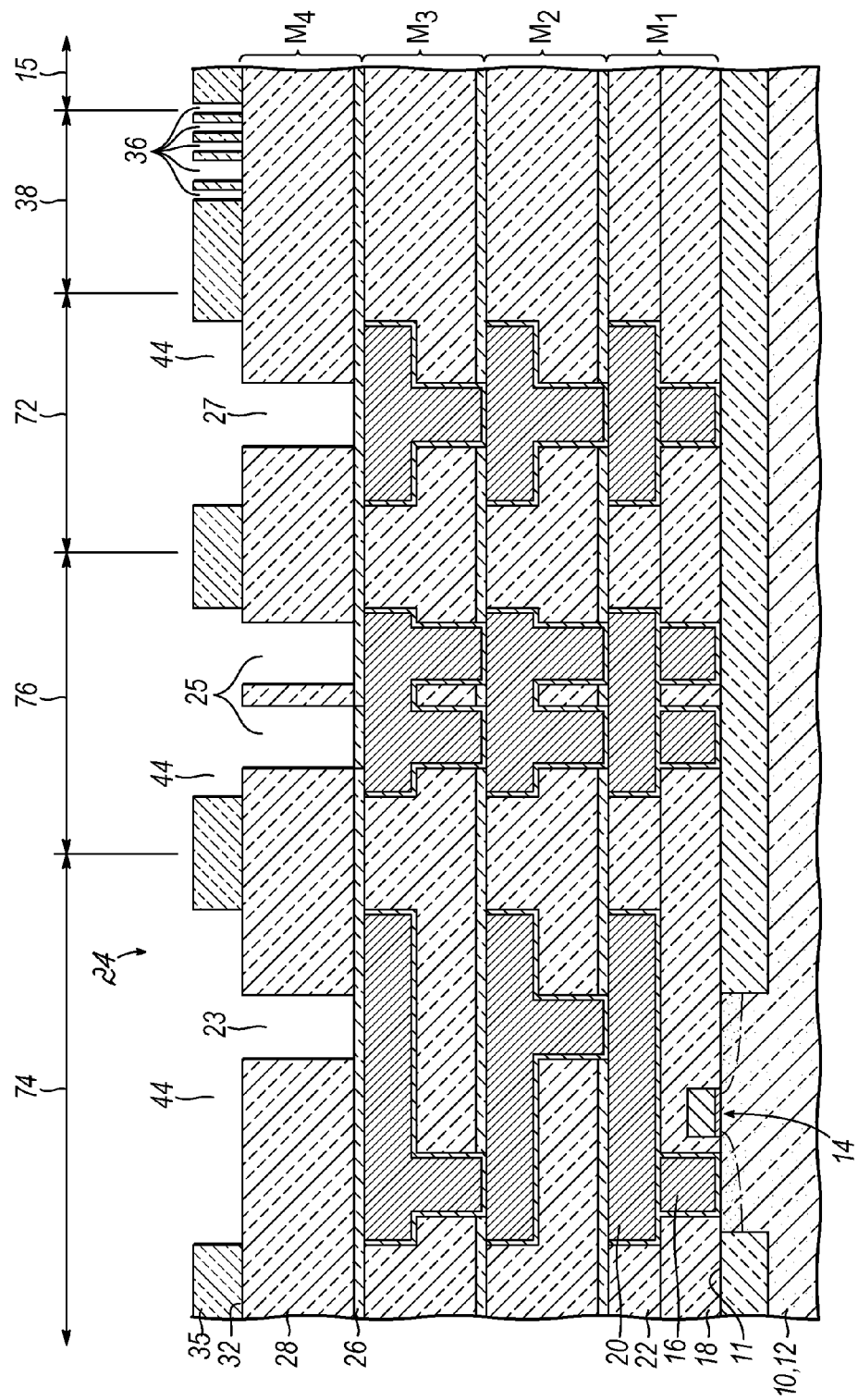

With reference to FIG. 3 in which like reference numerals refer to like features in FIG. 2 and at a subsequent fabrication stage, vias 23, 25, 27 are defined in the dielectric layer 28 that extend from the top surface 32 to the depth of a top surface of the etch stop layer 26. Specifically, the surface areas of dielectric layer 28 that are not masked by the final image pattern of the resist layer 30 (FIG. 2) are removed with an etching process, such as reactive ion etching (RIE), capable of producing substantially vertical sidewalls for the vias 23, 25, 27. The etchant gases selectively attack areas of the dielectric layer 28 not protected by the photoresist. After penetrating through the dielectric layer 28, the etch stop layer 26 halts the vertical progress of the etching process so that the underlying metallization in the M3 level is not etched.

The vias 23, 25, 27 are distributed at various locations in the dielectric layer 28 as determined by the image pattern in the photomask. After the vias 23, 25, 27 are formed, the residual resist layer 30 is removed from the top surface 32 of dielectric layer 28 with a wet chemical stripper or a dry oxidation-based photoresist removal technique such as plasma ashing with an oxygen plasma.

Another resist layer 35 composed of a radiation-sensitive organic material is applied with a spin coating process to the top surface 32 of dielectric layer 28. Resist layer 35 is composed of a positive photoresist that, when unexposed, is initially insoluble in a photoresist developer. As understood by a person having ordinary skill in the art, the portion of the positive photoresist in resist layer 35 that is exposed to radiation during the lithography process loses chemical stability and, as a result, becomes soluble to a photoresist developer. The portion of the positive photoresist in resist layer 35 that is unexposed to radiation during the lithography process remains chemically stable and, therefore, retains its insolubility when exposed to photoresist developer. The resist layer 35 originates from a liquid resist solution containing a resist resin dissolved in a solvent.

An adhesion promoter, such as hexamethyldisilazane (HMDS), may be initially applied on the top surface of the dielectric layer 28 to promote adhesion of the resist layer 35 to the dielectric layer 28. The spin coating process entails placing the wafer 10 on a spin coater, dispensing the liquid resist solution onto the top surface 32 of dielectric layer 28, and operating the spin coater to rapidly spin the wafer 10. Spinning disperses the liquid resist solution supplied to the center of the wafer 10 radially outward by centrifugal forces to coat the entire top surface 32 and to provide the resist layer 35 with a nominally uniform thickness independent of location on the top surface 32. A typical spin coating process runs at 1000 revolutions per minute (rpm) to about 5000 rpm for one minute or less and results in a physical layer thickness between about 0.5 microns and about 2.5 microns. The resist layer 35 is then heated in a soft baking or pre-baking process to drive off excess solvent and to promote partial solidification.

The soft-baked resist layer 35 is exposed to a pattern of radiation to impart a latent image of a trough or trench pattern. For optical lithography, the pattern of radiation is generated using a photomask and an optical stepper of a lithography tool and then imaged onto the resist layer 35. Regions of the resist layer 35 exposed to the radiation become chemically less stable. Regions of the resist layer 35 that are not exposed to the radiation remain chemically stable. This chemical modification of the exposed regions of the resist layer 35 permits subsequent removal by contact with a chemical developer.

Figure 6:
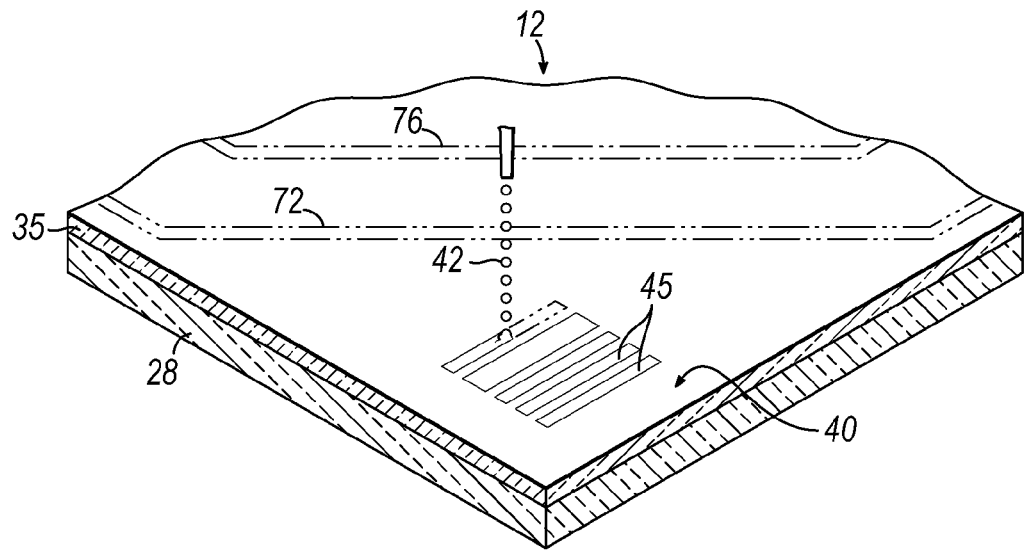
FIG. 6 is a schematic perspective view depicting the use of a stream of droplets of a positive resist solvent to form the resist openings in FIG. 3 for use in making the readable pattern.

For each of the product chips 12, openings 36 are provided in the resist layer 35 in a peripheral region 38 of the BEOL wiring structure 24 that borders one of the scribe-line channels 15 and is near one chamfered corner 40 of a future die 92 (FIG. 10) when the product chip 12 is singulated. Device structures, such as device 14, of the integrated circuit are not fabricated in the peripheral region 38, which leaves the peripheral region 38 as an electrically inactive, so far as the product chips 12 are concerned, and typically unused surface area of the wafer 10. The peripheral region 38 is outside of the image field of the mask used to form the latent image of a trough or trench pattern. In the representative embodiment and after the product chips 12 are singulated, the openings 36 are located near at least one of the chamfered corners 40 of each of the product chips 12, as best shown in FIG. 6. In the representative embodiment, the openings 36 have different widths and spacings, although the embodiments of the invention are not so limited.

As shown in FIG. 6, wetted regions 45 are formed in the positive photoresist of resist layer 35 by precisely dispensing droplets 42 of a positive resist solvent onto selected impact locations or areas of the resist layer 35 in the peripheral region 38. As explained below, the wafer 10 is moved with a high degree of precision relative to the impinging droplets 42 of positive resist solvent to promote the formation of the wetted regions 45. Because of a chemical reaction with the positive resist solvent, the wetted regions 45 lose their chemical stability so that these wetted regions become soluble when contacted by a positive photoresist developer. The wetted regions 45 in the resist layer 35 have a pattern that, in a subsequent stage of the fabrication process, is correlated spatially with openings 36 and a feature pattern 85 (FIG. 5) of metallization in the dielectric layer 28.

The positive resist solvent may be any organic solvent or mixture of organic solvents capable of dissolving the resist layer 35 upon contact or capable of chemically destabilizing the resist layer 35 so that exposure to the developer can form the openings. Candidate inorganic substances for the positive resist solvent include, but are not limited to, toluene, xylene, a ketone such as acetone, a polyhydric alcohol such as ethylene glycol, a cyclic ether such as dioxane, or an ester such as methyl acetate, ethyl acetate, or butyl acetate.

The resist layer 35 may be subjected to a post-exposure bake process before the developing process. The elevated temperature of the post-exposure bake process drives photoproduct diffusion in the resist layer 35, minimizes the negative effects of standing waves in the resist layer 35, and drives acid-catalyzed reactions in chemically amplified positive resists.

The resist layer 35 is then developed with the use of a developer to transform the latent image into a final image pattern with openings 44 characteristic of the trench pattern and openings 36 for the feature pattern 85. The openings 36, 44 in the resist layer 35 extend to the depth of the top surface 32 of the dielectric layer 28. Laterally dispersed surface areas of dielectric layer 28 are unmasked by openings 36, 44 so that the developer can locally wet the top surface 32 of the dielectric layer 28. The developer may be delivered on a spin coater in a manner similar to the delivery of the resist solution. An exemplary developer commonly used to develop positive photoresist is an alkali developing liquid, such as tetramethylammonium hydroxide (TMAH) or a mixture of TMAH and a surfactant. The resulting resist layer 35 on the wafer is then subjected to a hard-baking process, which solidifies the residual photoresist of the patterned resist layer 35 to increase durability and robustness.

The wetted regions 45, the openings 36, and, ultimately, the feature pattern 85 (FIG. 5) contain information that pertains to the particular product chip 12 on the wafer 10 to which applied. For example, the wetted regions 45, openings 36, and feature pattern 85 may provide a unique identification code for each of product chips 12. In one embodiment, the wetted regions 45, openings 36, and feature pattern 85 may include characters and/or symbols specifying, for example, a part or serial number encoding a location for a particular product chip 12 on the wafer 10 and a wafer identification code for the wafer 10. Alternatively, the characters and/or symbols contained in the wetted regions 45, openings 36, and feature pattern 85 may include information specifying a company name or a chip manufacturer, or other information such as a date code, a wafer lot identification code, chip history, testing data, and performance information.

The wetted regions 45, openings 36, and the features 80-84 (FIG. 5) of the feature pattern 85 may include fewer individual features than in the representative embodiment or more features than in the representative embodiment. The wetted regions 45, openings 36, and features 80-84 may, for example, be arranged as a bar code or other type of machine readable characters and/or symbols.

In an alternative embodiment, data compression may be optionally used to expand the amount of information recorded in the wetted regions 45, openings 36, and feature pattern 85. For example, wetted regions 45, openings 36, and features 80-84 may include a two-dimensional array of identification markings of any desired size and shape dots, characters or any other type symbol or symbols capable of encoding information. Such high density formats for wetted regions 45, openings 36, and features 80-84 are understood by those of ordinary skill in the art. Data compression of this type may be used, for example, to at least partially compensate for the relatively low spatial resolution of available imaging techniques in comparison to the relatively high spatial resolutions achievable with photolithography techniques.

The wetted regions 45 and, ultimately, the openings 36 are formed independently of the openings 44. As a result, the wetted regions 45 are formed independent of the mask used in conjunction with the optical stepper to form the openings 44 in each of the product chips 12.

Figure 4:
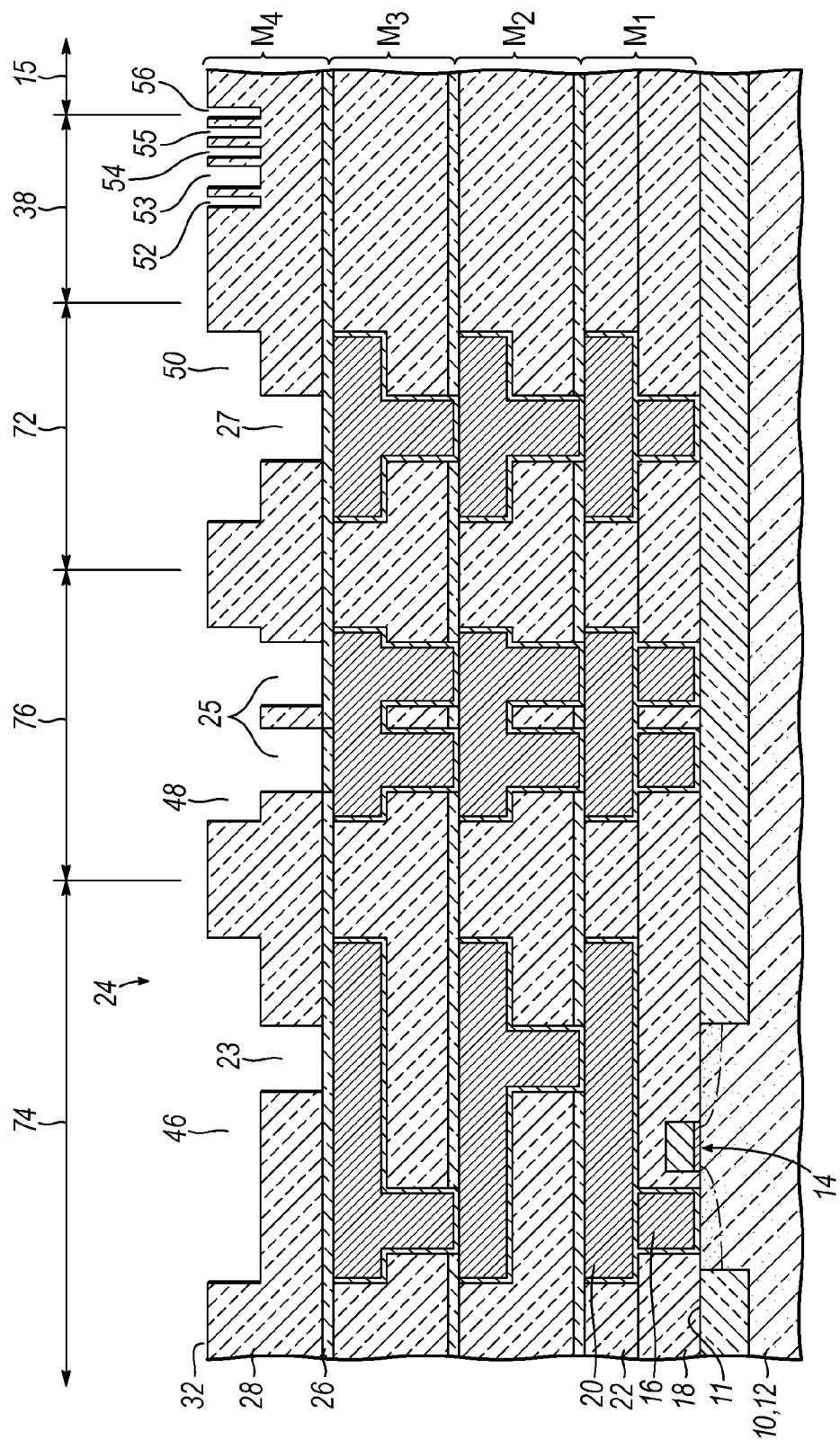

With reference to FIG. 4 in which like reference numerals refer to like features in FIG. 3 and at a subsequent fabrication stage, wiring trenches 46, 48, 50 are formed in the dielectric layer 28 at the locations of the openings 44 in the patterned resist layer 35. Information trenches 52, 53, 54, 55, 56 are formed in the dielectric layer 28 at the locations of the openings 36 in the patterned resist layer 35. The wiring trenches 46, 48, 50 and information trenches 52-56 expose the top surface 32 of the dielectric layer 28.

Specifically, trenches 46, 48, 50, 53-56 are formed by removing regions of dielectric layer 28 that are not masked by the resist layer 35 (FIG. 3) with an anisotropic etching process, such as an RIE process. The directional etching process is capable of producing substantially vertical sidewalls for the wiring trenches 46, 48, 50 and substantially vertical sidewalls for the information trenches 52-56. The resist layer 35 protects the masked surface areas of the dielectric layer 28 during the etching process. An optional bottom anti reflective coating layer (not shown) may be deposited in the vias 23, 25, 27, before the resist layer 35 is deposited, to ensure that the etch stop layer 26 is not breached during the trench etching process, which protects the underlying metallization in the M3 level of the BEOL wiring structure 24.

The resist layer 35 is removed from the top surface of dielectric layer 28 with a wet chemical stripper or a dry oxidation-based photoresist removal technique. The wiring trenches 46, 48, 50 and the information trenches 52-56 include substantially vertical sidewalls that extend partially through the dielectric layer 28. Vias 23, 25, 27 communicate with the wiring trenches 46, 48, 50, respectively, as well as with the metallization in the underlying M3 level of the BEOL wiring structure 24.

Figure 5:
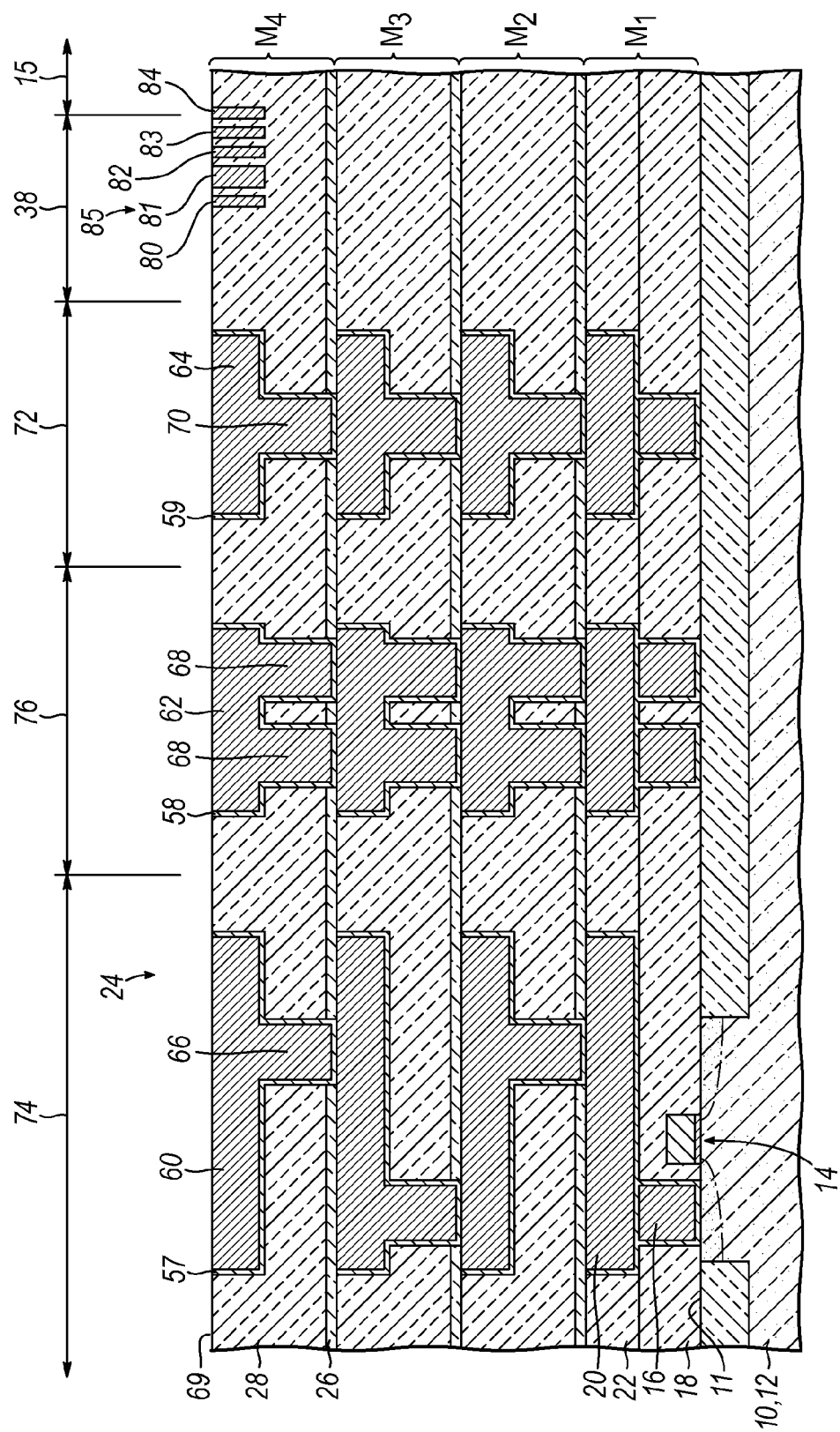

With reference to FIG. 5 in which like reference numerals refer to like features in FIG. 4 and at a subsequent fabrication stage, liner layers 57, 58, 59 are applied in the vias 23, 25, 27 and the wiring trenches 46, 48, 50. Liner layers 57, 58, 59 may be composed of any conductive material or multilayer combination of conductive materials recognized by a person having ordinary skill in the art. Liner layers 57, 58, 59 may comprise a conductive material such as tantalum (Ta), tantalum nitride (TaN), titanium (Ti), titanium nitride (TiN), tungsten (W), ruthenium (Ru), iridium (Ir), rhodium (Rh), platinum (Pt), chromium (Cr), niobium (Nb), or another suitable conductor with material properties appropriate to operate as a diffusion barrier and an adhesion promoter for a subsequent metal plating process to fill the vias 23, 25, 27 and wiring trenches 46, 48, 50. The liner layers 57, 58, 59 may be deposited, for example, by conventional deposition processes well known to those skilled in the art, including but not limited to a physical vapor deposition (PVD) process, ionized-PVD (iPVD), ALD, plasma-assisted ALD, CVD, and PECVD.

Conductive wires 60, 62, 64 are formed in the open spaces inside the wiring trenches 46, 48, 50 and conductive studs 66, 68, 70 are formed in the open spaces inside the vias 23, 25, 27. Conductive wires 60, 62, 64 and conductive studs 66, 68, 70 are composed of a conductor such as copper (Cu), aluminum (Al), alloys of these primary metals such as AlCu, W, and other similar metals. The conductor is deposited as a blanket layer by conventional deposition processes, such as CVD, PECVD, an electrochemical process such as electroplating or electroless plating, chemical solution deposition, PVD, DC or RF sputtering, and the like. A thin seed layer (not shown) may be deposited inside the vias 23, 25, 27 and wiring trenches 46, 48, 50 to promote the deposition process. After the blanket deposition, portions of the conductor fill the vias 23, 25, 27 and wiring trenches 46, 48, 50 and cover the field of the dielectric layer 28. A chemical-mechanical polishing (CMP) process is employed to remove excess conductor from the field of the dielectric layer 28 and to planarize a top surface 69 of the dielectric layer 28 and embedded conductive wires 60, 62, 64.

The conductive wires 62, 64 and conductive studs 68, 70 are replicated in the underlying M1, M2 and M3 levels of the BEOL wiring structure 24. As best shown in FIGS. 5 and 6, the stacked conductive wire 64 and studs 70 in the different metallization levels define a crack stop region, which is generally indicated by reference numeral 72. The crack stop region 72 is disposed adjacent to the peripheral region 38 and defines a boundary generally between an active circuit region 74 of each product chip 12 and one of the scribe-line channels 15. The crack stop region 72 functions to prevent the propagation of cracks, which are initiated by chipping and cracking formed along peripheral edges of the product chip 12 during a subsequent dicing operation, into the active circuit region 74 of each product chip 12. Similarly, the stacked conductive wires 64 and studs 70 in the different metallization levels define a moisture barrier or edge seal, which is generally indicated by reference numeral 76, located between the crack stop region 72 and one of the scribe-line channels 15. The crack stop region 72 is proximate to the physical peripheral edge of each of the product chip 12 following singulation.

The conductive wires 60 and conductive studs 66 are also replicated in the underlying M1, M2 and M3 levels of the BEOL wiring structure 24 but lack the uniformity in construction characteristic of the crack stop region 72 and edge seal 76. Specifically, the conductive wires 60 and conductive studs 66 are routed and placed to efficiently interconnect the devices 14 of the integrated circuit on each product chip 12 and to provide circuit-to-circuit connections, and may also establish contacts with input and output terminals of each product chip 12.

Portions of the conductor used to form the conductive wires 60, 62, 64 and conductive studs 66, 68, 70 and/or portions of the conductor used to form the liner layers 57, 58, 59 fill the information trenches 52-56 to define features 80, 81, 82, 83, 84 of a feature pattern 85 in the dielectric layer 28. The feature pattern 85 is arranged and configured to be read by a machine and converted to retrieve the encoded information. The feature pattern 85 is located in the unused peripheral region 38 on the front side of each product chip 12 and outside of the crack stop region 72 in what defines, after singulation into die, the chamfered corner 40.

In the representative embodiment, the feature pattern 85 is located in the M4 level that constitutes the uppermost metallization level in the BEOL wiring structure 24. However, in an alternative embodiment, the feature pattern 85 may be located in a different metallization level that happens to represent the uppermost metallization level if the BEOL wiring structure 24 includes more than four levels or less than four levels. In other alternative embodiments, feature pattern 85 may be located in a metallization level that is not the topmost level so long as the feature pattern 85 is capable of being imaged.

The conductive wires 60, 62, 64 and conductive studs 66, 68, 70 form a dual-damascene structure formed by a via-first, trench-last process sequence. In an alternative embodiment, the vias 23, 25, 27 and the wiring trenches 46, 48, 50 may be formed with a trough-first, via-last dual-damascene process.

The ability to perform dual damascene process steps regardless of order is familiar to a person having ordinary skill in the art. In yet another alternative embodiment consistent with a single-damascene process, the vias 23, 25, 27 may be formed in a lower portion of the dielectric layer 28 and filled with a conductor, and then the wiring trenches 46, 48, 50 may be formed in an upper portion of the dielectric layer 28 and filled with a conductor. In either alternative embodiment, the information trenches 52-56 are concurrently formed in the dielectric layer 28 along with wiring trenches 46, 48, 50.

A passivation layer (not shown) of an organic polymer, such as polyimide, or another suitable material is formed over the M4 level. The passivation layer includes openings that expose bond pads and probe pads at other locations in the M4 level.

Figure 10:
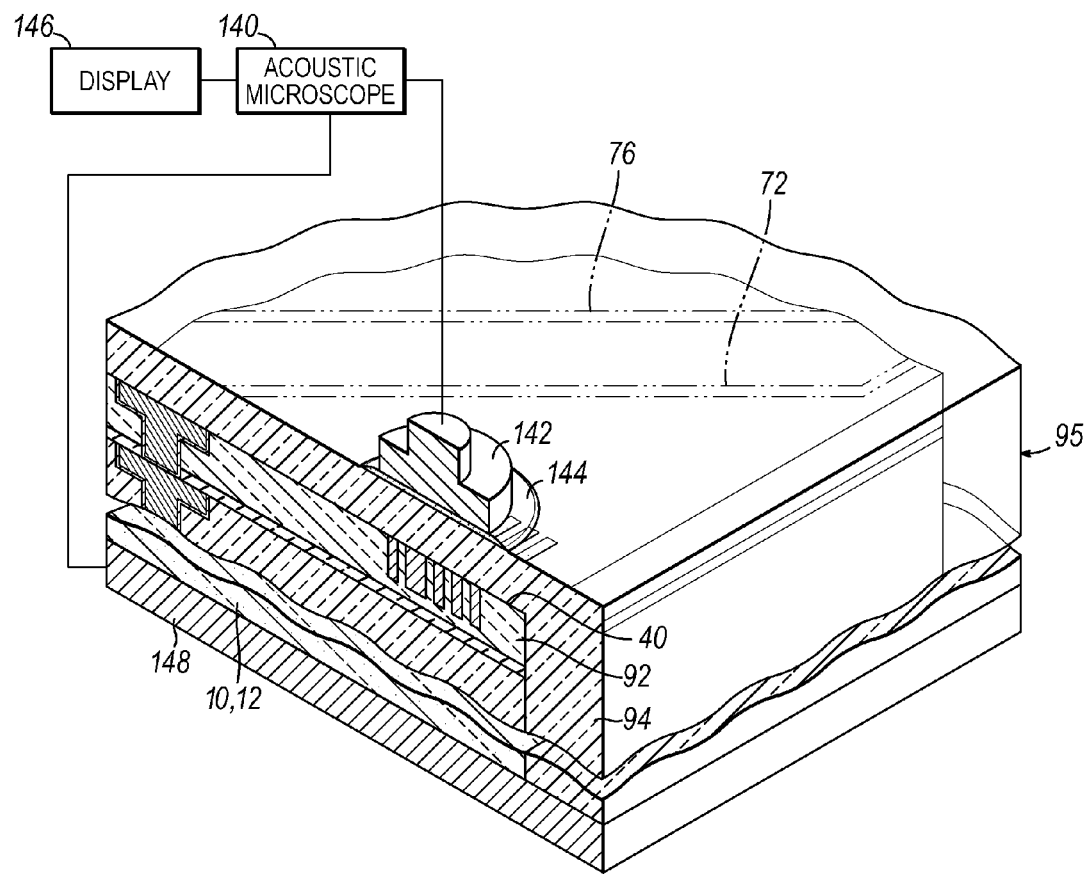
FIG. 10 is a diagrammatic perspective view of an acoustic microscope that may be used to read the information embedded in the back-end-of-line metallization level of a package including a die singulated as one of the product chips from the wafer of FIG. 1.

Each of the product chips 12 is ultimately singulated from the wafer 10 to form a discrete die 92 (FIG. 10). Each die 92 is individually housed inside a package 94 (FIG. 10), or housed with other die in a multi-chip package, to define a packaged die 95 (FIG. 10) that is configured with external leads for either socket mount or surface mount on a printed circuit board. The package 94, which encapsulates and surrounds the die 92 with a layer of a cured polymer resin or plastic, such as a non-conductive epoxy, or a layer of a ceramic material, connects pads on the die 92 to external pins of the package 94, which are connected with the printed circuit board using the leads. The package 94 is interposed between the feature pattern 85 and an exterior observer of the packaged die 95. In one embodiment, the package 94 is composed of a material capable of permitting the propagation of sound waves with limited attenuation.

The resulting integrated circuit chips 12 can be distributed by a fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip 12 is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 6A:
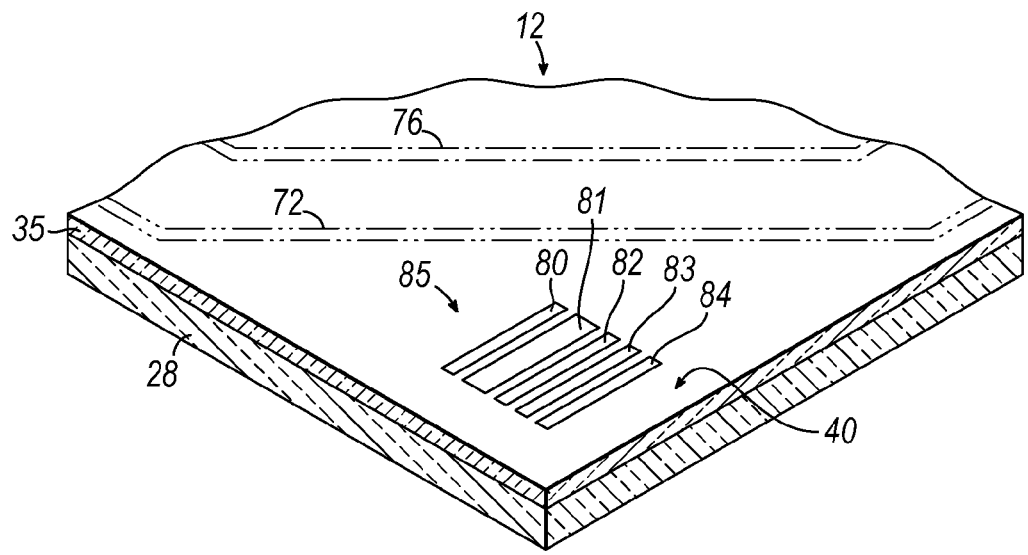
FIG. 6A is a schematic perspective view similar to FIG. 6 in which the readable pattern has been formed in a dielectric layer of the involved metallization level.
Figure 7:
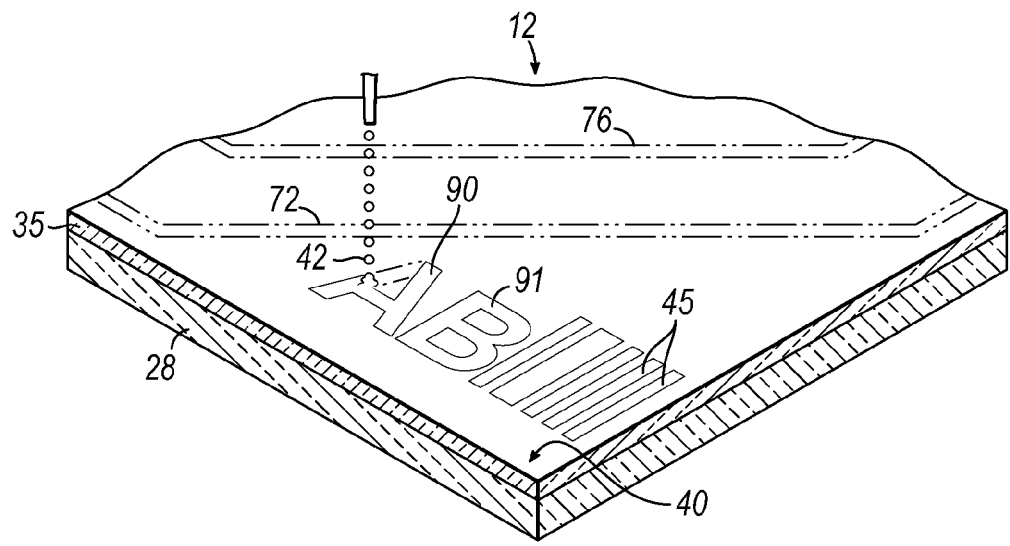
FIG. 7 is a schematic perspective view similar to FIG. 6 depicting the use of the stream of positive resist solvent droplets to form resist features for a readable pattern in accordance with an alternative embodiment of the invention.
Figure 7A:
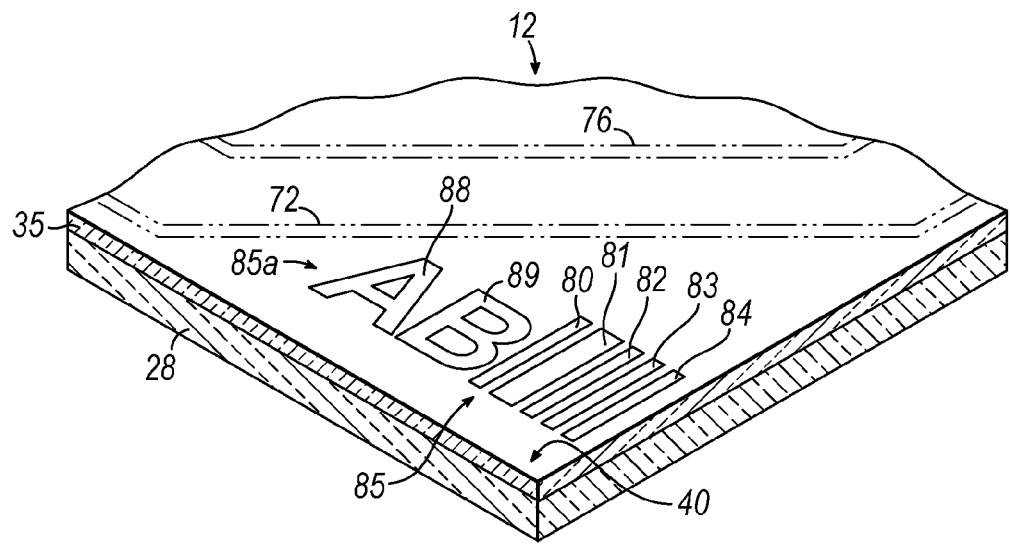
FIG. 7A is a schematic perspective view similar to FIG. 7 in which the readable pattern of the alternative embodiment has been formed in the metallization for a dielectric layer of the involved metallization level.

With reference to FIGS. 7 and 7A and in accordance with an alternative embodiment of the invention, a feature pattern 85a (7A) similar to feature pattern 85 (FIG. 6A) may further include features, such as the representative characters 88, 89 (FIG. 7A). The characters 88, 89 are configured to be imaged and directly read by a human in an image of the feature pattern 85a. The characters 88, 89 may be used in combination with the features 80-84 of feature pattern 85, as shown in this embodiment, or may be used alone without features 80-84. The characters 88, 89 may be arranged and configured to form words, word portions, abbreviations, symbols, or other text capable of being read and comprehended by a human. In one embodiment, the characters 88, 89 are alphanumeric characters that form a portion of a part or serial number, optionally along with other characters (not shown), encoding a location for a particular product chip 12 on a wafer 10 and a wafer identification code. If the characters 88, 89 have a plain text format, the information may be interpreted without any type of data translation.

To generate the characters 88, 89, additional wetted regions 90, 91 (FIG. 7) are formed in the resist layer 35 that are similar to the openings 36 (FIGS. 3, 6) at the time that the wetted regions 36 are formed. Eventually, the pattern of wetted regions 90, 91 is developed into openings (not shown) like openings 36 (FIG. 4) and transferred by etching, when the information trenches 52-56 (FIG. 4) are etched, to define additional information trenches. The information trenches 52-56 and the information trenches used to form the characters 88, 89 are ultimately filled with portions of a conductor in the damascene process to define the feature pattern 85a.

Figure 8:
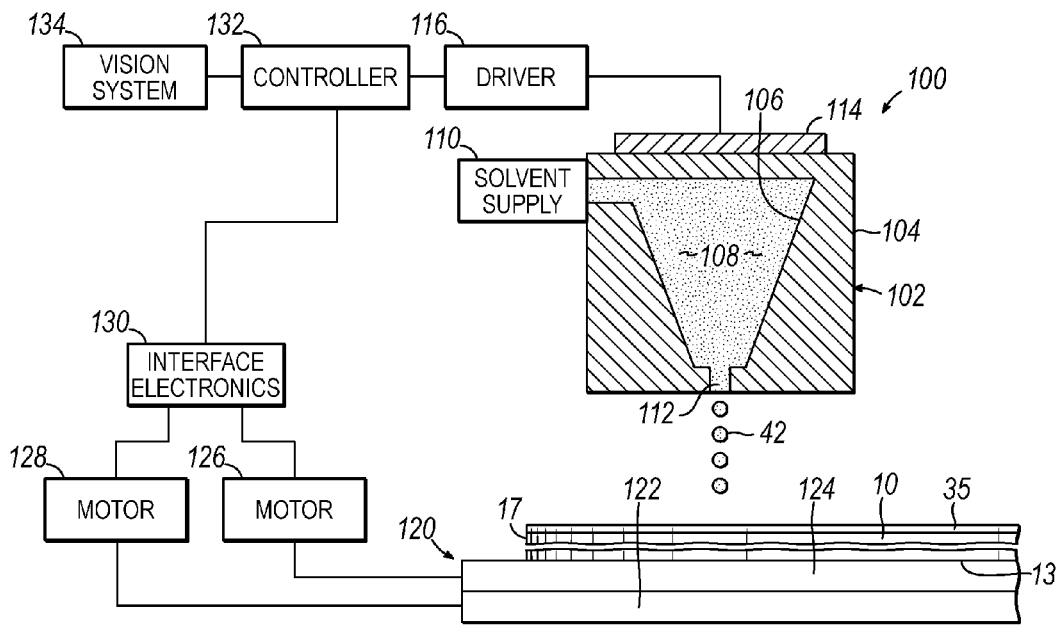
FIG. 8 is a diagrammatic perspective view in partial cross-section of an embodiment of a writing system configured to dispense positive resist solvent, as shown in FIGS. 6 and 7, to form the resist features.
Figure 9:
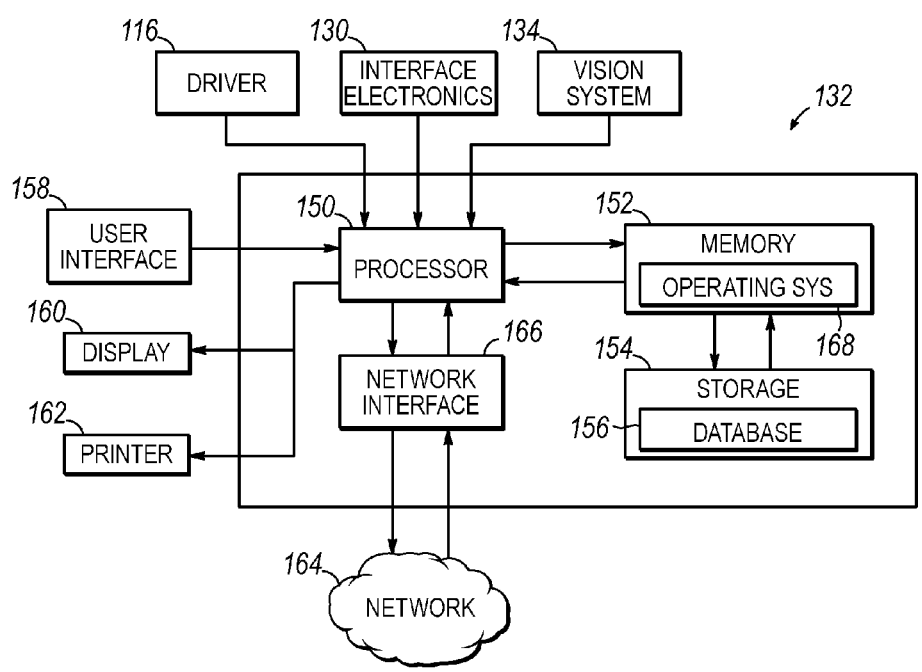
FIG. 9 is a block diagram of an exemplary hardware and software environment for a controller suitable for interfacing with the writing system in FIG. 8.

With reference to FIGS. 8 and 9 in which like reference numerals refer to like features in FIGS. 1-7, a representative embodiment of a writing system 100 is depicted that is capable of forming the wetted regions 45, as well as wetted regions 90, in the resist layer 35 in the peripheral region 38 proximate to the scribe-line channel 15 on each of the product chips 12, as described above in the context of FIG. 3. The writing system 100 relies on a piezoelectric jet 102 to dispense the positive resist solvent directly on the wafer 10. The piezoelectric jet 102 includes a head 104 with a reservoir or chamber 106 that contains positive resist solvent 108, a developer supply 110 that is in fluid communication with the chamber 106, and a nozzle 112 defining an ejection path in the head 104 for amounts of the positive resist developer from the chamber 106. The developer supply 110 is used to continuously replenish the volume of positive resist solvent confined within the chamber 106 as amounts of solvent are serially ejected by the piezoelectric jet 102 from the nozzle 112 in the head 104.

The piezoelectric jet 102 further includes a piezoelectric element 114 that communicates with the solvent-filled chamber 106. The piezoelectric element 114 is composed of a material that exhibits a marked piezoelectric effect. When potential difference is applied by a driver 116 to the piezoelectric element 114, the piezoelectric material of the piezoelectric element 114 changes shape or size, which generates a pressure pulse in the positive resist solvent within the chamber 106 and forces an amount of positive resist solvent from the chamber 106 through the nozzle 112. Each ejected amount coalesces into one of the droplets 42 after ejection from the nozzle 112. Repeatedly applying and removing the potential difference generates a series of droplets 42 that impinge the resist layer 35.

The head 104 of the writing system 100 may include a droplet energizing element that operates by a different type of dispensing mechanism that is capable of ejecting droplets 42 of the positive resist solvent from the nozzle 112. Rather than piezoelectric actuation, for example, a heating element (not shown) could be substituted for the piezoelectric element 114 to heat the positive photoresist solvent in the chamber 106 to a point that it boils and ejects solvent from the nozzle 112 because of the expansion of the resultant gas bubbles. Alternatively, a magnetostrictive actuator may be used as a droplet energizing mechanism in some instances.

Alternatively, the head 104 may be equipped with multiple nozzles each capable of ejecting a discrete droplet of positive resist solvent. Typically, each nozzle will have associated therewith a droplet energizing element, such as piezoelectric element 114. Alternatively, a single droplet energizing element may be coupled with all nozzles in parallel.

The writing system 100 further includes a wafer table 120 configured to support and move the wafer 10. The wafer table 120 includes a first wafer stage 122 configured to move the wafer 10 in one direction (for example, an X direction) within a plane and a second wafer stage 124 configured to move the wafer 10 in another direction (for example, a Y direction) within the plane. Typically, the two motion directions are orthogonal to each other. For example, the X-direction may be front to back and the Y-direction may be left to right in a representative reference frame. The writing system 100 further includes motors 126, 128 that, when energized, are used to respectively move the wafer stages 122, 124. The wafer table 120 is configured to be moved very precisely in a plane containing the X and Y directions by a drive mechanism such as worm screws driven by the motors 126, 128 or by motors 126, 128 that have the form of linear motors and slides.

The writing system 100 includes motor interface electronics 130 for controlling the motors and a controller 132 used to coordinate the operation of the motors 126, 128 and the action of the piezoelectric jet 102. The controller 132 is also connected with the driver 116 for the piezoelectric element 114 so that the operation of the wafer table 120 is coordinated with the operation of the piezoelectric jet 102. The motor interface electronics 130 links the controller 132 with the motors 126, 128 and translates movement commands from the controller 132 into analog instructions for the motors 126, 128.

A vision system 134, which is also connected with the controller 132, is used to visually image the surface of the resist layer 35. The vision system 134 is aimed with a field-of-view that includes all or a portion of the range of travel for the wafer table 120. In a conventional vision system, the vision system 134 includes a camera configured to capture pixilated gray-scale or color images of all or a portion of the wafer 10 and communicate image data as a stream of electrical or optical signals to the controller 132. The controller 132 is configured with image analysis software used to analyze features in acquired images.

In use, the wafer table 120 of the writing system 100 is employed to index the wafer 10 in a controlled manner so that the feature pattern 85 is applied to the resist layer 35 on each of the product chips 12 on the wafer 10. Specifically, the wafer 10 is aligned by identifying alignment marks (not shown) on the wafer 10 and, optionally, wafer stage marks using one or more images acquired with the vision system 134. The wafer table 120 is operated to move the wafer 10 so that the peripheral region 38 is located in a working relationship with the piezoelectric jet 102 of the writing system 100. The controller 132 sends instructions through the motor interface electronics 130 to energize the motors 126, 128 for indexing the wafer stages 122, 124 in a two-dimensional pattern. The indexing may be performed in discrete increments or may comprise continuous motion. The piezoelectric jet 102 is operated by the controller 132 to deliver the droplets 42 of positive resist solvent for forming wetted regions 45.

As the droplets 42 are serially delivered to the resist layer 35, the motors 126, 128 are operated by the controller 132 to drive the stages 122, 124 in a motion pattern based upon the desired pattern of the wetted regions 45. The motion causes the droplets 42 to be delivered in a desired feature pattern effective to form the wetted regions 45 subsequently used to etch the information trenches 52-56 in dielectric layer 28. The droplets 42 attach themselves to the resist layer 35 through a wetting action and proceed to locally modify the chemical stability of the resist layer. A shield (not shown) may be required to restrict splashed solvent or solvent overspray from reaching active circuit region 74.

The controller 132 may cause the wafer stage 122 to move the wafer 10 and the piezoelectric jet 102 to eject droplets 42 of the solvent so that the wetted regions 45 are directly written into the peripheral region 38. At suitable instants in time of the piezoelectric jet 102, the controller 132 sends a control signal to the driver 116 to trigger the piezoelectric element 114. Each trigger control signal causes the piezoelectric jet 102 to eject one of the droplets 42 of the positive resist solvent from the nozzle 112 in the head 104. When the wafer 10 is in an appropriate position, taking into account the time it takes for any droplet 42 to travel from the nozzle 112 to the wafer 10, the velocity, if any, at which the wafer 10 is moving, and other factors, individual droplets 42 are ejected from the nozzle 112. Depending on the pattern to be printed, soon thereafter, another droplet 42 may be ejected, and another, and a whole group of droplets 42. Time delays between the ejection of consecutive droplets 42 is dependent on the pattern to be printed, the velocity of wafer motion, etc. Thus, when the writing system 100 is nominally printing, there are time periods during which one of the droplets 42 is being ejected from the nozzle 112, and time periods during which no droplet 42 is being ejected.

Alternatively, the controller 132 may cause the wafer stage 122 to move the wafer 10 so that the peripheral region 38 passes in a series of linear passes of a raster pattern beneath the piezoelectric jet 102. At suitable instants in time of the piezoelectric jet 102, the controller 132 sends a control signal to the driver 116 to trigger the piezoelectric element 114. At the end of each linear pass, the controller 132 causes the wafer stage 122 to adjust the spatial position of the wafer 10 perpendicular to the travel axis of wafer stage 124 before initiating a new linear pass. The wafer stages 122, 124 of the writing system 100 continue to move the wafer 10 in successive linear passes until the wetted regions 45 have been fully formed.

The positive resist solvent is discharged so that the droplets 42, after contacting and attaching to the resist layer 35, form continuous wetted regions 45 of photoresist on different surface areas of the resist layer 35 that reflect the openings 36. The solvent penetrates into the positive photoresist within these wetted regions 45. Gaps are maintained between adjacent wetted regions 45 so that, after developing, regions of the positive photoresist remain in the gaps between adjacent pairs of openings 36 to mask the dielectric layer 28 during the etching process that forms the information trenches 52-56.

The resolution of the openings 36, the resolution of the ensuing information trenches 52-56, and the resolution of the resulting features 80-84 in the feature pattern 85 may be as fine as one micron. However, finer or coarser resolutions may be desirable for the features 80-84. Of course, increases in the amount of information in the feature pattern 85 will generally require expansion of the chamfered corner 40 at the expense of product real estate in the active circuit region 74. Concomitantly, finer resolutions for the feature pattern 85 may be required as the amount of information contained in the features 80-84 is increased to minimize the effect on the real estate of the product chip 12 as the amount of information is increased. The piezoelectric jet 102 may form droplets 42 with sizes as small as one (1) micron to two (2) microns, or less, and submicron resolution is available for the motion of the wafer stages 122, 124.

The writing system 100 may be a stand-alone unit in which instance the controller 132 is integrated into the system 100. Alternatively, the controller 132 may be associated with a higher-level server in the production line hierarchy that directs instructions to the writing system 100.

In either embodiment and as best shown in FIG. 9, the controller 132 may include a processor 150, which may be coupled to vision system 134 and the motor interface electronics 130, and the driver 116 for the piezoelectric element 114 among other devices, and a memory 152 coupled with the processor 150. Processor 150 may represent one or more individual processors (e.g., microprocessors), and memory 152 may represent the random access memory (RAM) devices comprising the main storage of controller 132, as well as any supplemental levels of memory, e.g., cache memories, non-volatile or backup memories (e.g., programmable or flash memories), read-only memories, etc. In addition, memory 152 may be considered to include memory storage physically located elsewhere in controller 132, e.g., any cache memory in a processor 150, as well as any storage capacity used as a virtual memory, e.g., as stored on a mass storage device 154. The mass storage device 154 may contain a cache or other data storage, which may include one or more databases 156.

Controller 132 also typically receives a number of inputs and outputs for communicating information externally. For interfacing with a user or operator, controller 132 typically includes one or more of a user interface 158 with various input devices, such as a keyboard, a mouse, a trackball, a joystick, a touchpad, a keypad, a stylus, and/or a microphone, among others. Controller 132 may also include a display 160, such as a CRT monitor, an LCD display panel, and/or a speaker, among others, or other type of output device, such as a printer 162. The interface to controller 132 may also be through an external terminal connected directly or remotely to controller 132, or through another computer communicating with controller 132 via a network 164, modem, or other type of recognized communications device. Controller 132 communicates on the network 164 through a network interface 166.

Controller 132 operates under the control of an operating system 168 and executes or otherwise relies upon various computer software applications, components, programs, objects, modules, data structures, etc. In general, the routines executed to implement the embodiments of the invention, whether implemented as part of an operating system or a specific application, component, program, object, module or sequence of instructions will be referred to herein as "computer program code", or simply "program code". The computer program code typically comprises one or more instructions that are resident at various times in various memory and storage devices in a computer, and that, when read and executed by one or more processors in a computer, causes that computer to perform the steps necessary to execute steps or elements embodying the various aspects of the invention.

The writing system 100 may provide a user with the ability to program the controller 132 with instructions for the production of wetted regions 45 (FIGS. 3, 6) and/or wetted regions 90 (FIG. 7) in the resist layer 35, which is ultimately reflected in the form of the feature pattern 85 or 85a after the damascene process concludes. The user may provide instructions for the production of the wetted regions 45, 90 to the controller 132 via the user interface 158. Alternatively, the instructions for the production of the wetted regions 45, 90 may be received remotely, such as from another computer that is operatively coupled to controller 132 through network 164, for example. The other computer may be, for example, the controller for a photolithography tool. The software executing on the controller 132 may be configured to automatically assign different values to the information contained in the feature pattern 85 or 85a for different product chips 12.

With reference to FIG. 10, a reading apparatus in the representative form of a scanning acoustic microscope 140 is used to image the information engrained in the feature pattern 85 (FIGS. 6, 6A) and/or feature pattern 85a (FIGS. 7, 7A) from the front side 11 of the die 92. The scanning acoustic microscope 140 is electrically coupled with a transducer 142, which is configured to emit a focused acoustic wave of sound energy communicated to the packaged die 95 and ultimately through the package 94 to the die 92. The transducer 142, which is placed in proximity to the packaged die 95 when imaging the feature pattern 85, also acts as a detector for detecting the acoustic beam reflected from the feature pattern 85 and other structures like the crack stop region 72, etc. The transducer 142 converts time-modulated electrical energy into mechanical vibrations to generate an acoustic wave. The transducer 142 may be composed of a material, such as lead zirconate titanate (PZT), that exhibits a marked piezoelectric effect and, as a result, is capable of energy conversion by this mechanism. The scanning acoustic microscope 140 includes a display 146 and a multi-axis stage 148 used to move the packaged die 95 relative to the transducer 142. The display 146 is configured to display an image of the information contained in the feature pattern 85 to an observer. The multi-axis stage 148 may be similar in construction to the wafer table 120 (FIGS. 8, 9) for the writing system 100.

A coupling fluid 144, such as distilled water or alcohol, may be present in a thin liquid film between the transducer 142 and the package 94. The coupling fluid 144 promotes efficient propagation of the ultrasound waves delivered to and from the die 92 and package 94.

In use, the scanning acoustic microscope 140 sends an electrical pulse train to the transducer 142, which converts the electrical energy into mechanical vibrations to generate an acoustic wave. The transducer 142 launches the acoustic wave, which carries sound energy, as a train of ultrasonic pulses through the working fluid 144 for transmission into the coupling fluid 144 and, subsequently, into and through the package 94 and die 92. The transducer 142 also receives sound pulses reflected from the product chip 12. Irregularities, such as discontinuities and other disturbances like the feature pattern 85, and/or the feature pattern 85a, in the product chip 12, are detectable by reflection because of differences in acoustical impedance produced by their presence. The transducer 142 transforms the reflected sound pulses into electromagnetic pulses and communicates the electromagnetic pulses in a data stream to the scanning acoustic microscope 140.

The scanning acoustic microscope 140 may display this information received from the transducer 142 as an image on the display 146 in which pixels have defined gray-scale values contingent upon the pulse amplitude. The images may be deduced from changes in reflected peak amplitude, time of flight, phase inversion, or other imaging techniques familiar to a person having ordinary skill in the art of scanning acoustic microscopy. The scanning acoustic microscope 140 may analyze the raw image using an image analysis program as known to one skilled in the art.

In alternative embodiments of the invention, the reading apparatus may rely on a scanning beam of a different type of penetrating electromagnetic energy outside of the acoustic band in the electromagnetic spectrum, including but not limited to infrared radiation, terahertz radiation, or x-rays. In an event, the acoustic energy or penetrating electromagnetic energy penetrates through the die package 94 and the die 92 nondestructively and non-invasively so that the feature pattern 85, 85a carried on the die 92 can be imaged without damaging the package die 95.

In an embodiment of the invention, the feature pattern 85, 85a applied to each of the product chips 12 on wafer 10 may be used in conjunction with die testing or integrated circuit failures. Armed with knowledge from the feature pattern 85, 85a, any arbitrary die 92 may be correlated with the specific location of the corresponding product chip 12 on the parent wafer 10. These associations may be used to gather and track statistics based on a lot of wafers, a single wafer, or individual die. The statistics may show, for example, trends in failures of parts of a particular wafer lot or a particular parent wafer location for a wafer lot.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when a structure is described as being "connected" or "coupled" to or with another structure, it can be directly connected or coupled with the other structure or, instead, one or more intervening structures may be present. In contrast, when a structure is described as being "directly connected" or "directly coupled" to another structure, intervening structures are present. When a structure is described as being "indirectly connected" or "indirectly coupled" to another structure, at least one intervening structure is present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of reading information stored as a pattern of metal features in a metallization level of a back-end-of-line (BEOL) wiring structure carried on a packaged die, the method comprising:
    directing a beam of sound energy into the packaged die and toward a peripheral region of the die between an active circuit region and a scribe-line channel;
    detecting the sound energy reflected from the pattern of metal features in the peripheral region;
    converting the reflected sound energy into an image of the pattern of metal features; and
    determining the information relating to the manufacture of the die from the image of the pattern of metal features, wherein the metal features specify at least a portion of a part number, at least a portion of a serial number, a wafer identification for a wafer used to fabricate the die, or a product chip location for the die on the wafer.

2. The method of claim 1 further comprising:
    displaying the image as pixels on a display.

3. The method of claim 2 wherein the pixels are presented as gray-scale values.

4. The method of claim 1 further comprising:
    generating failure analysis data from the information.

5. The method of claim 4 further comprising:
    using the failure analysis data to associate the die with a particular lot of wafers, a particular wafer, or a position of a product chip within a wafer.

6. The method of claim 1 wherein the features of the pattern comprise a plurality of machine-readable characters or a plurality of machine-readable symbols.

7. The method of claim 1 wherein the features of the pattern further comprise one or more characters capable of being read and comprehended by a human.

8. The method of claim 1 wherein the features of the pattern further comprise alphanumeric characters.

9. The method of claim 6 wherein the machine-readable characters or the machine-readable symbols comprise identification markings arranged in a two-dimensial array.

10. The method of claim 1 further comprising:
    correlating the information with die testing.

* * * * *

UNITED STATES PATENT AND TRADEMARK OFFICE
CERTIFICATE OF CORRECTION

PATENT NO. : 8,565,510 B2  Page 1 of 1
APPLICATION NO. : 13/359818
DATED : October 22, 2013
INVENTOR(S) : Cohn et al.

It is certified that error appears in the above-identified patent and that said Letters Patent is hereby corrected as shown below:

On the Title page, Item [75], Inventors, change "Richland" to --Richmond--.

Signed and Sealed this
Fourth Day of February, 2014

Michelle K. Lee
*Deputy Director of the United States Patent and Trademark Office*